United States Patent
Hou et al.

(10) Patent No.: US 10,141,510 B2
(45) Date of Patent: Nov. 27, 2018

(54) OLED DISPLAY PANEL, MANUFACTURING METHOD THEREOF AND DISPLAY DEVICE

(71) Applicant: BOE TECHNOLOGY GROUP CO., LTD., Beijing (CN)

(72) Inventors: Wenjun Hou, Beijing (CN); Ying Cui, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/321,554

(22) PCT Filed: Mar. 4, 2016

(86) PCT No.: PCT/CN2016/075622
§ 371 (c)(1),
(2) Date: Dec. 22, 2016

(87) PCT Pub. No.: WO2016/150294
PCT Pub. Date: Sep. 29, 2016

(65) Prior Publication Data
US 2017/0213965 A1    Jul. 27, 2017

(30) Foreign Application Priority Data
Mar. 24, 2015   (CN) .......................... 2015 1 0130566

(51) Int. Cl.
*H01L 51/56*   (2006.01)
*H01L 51/00*   (2006.01)
(Continued)

(52) U.S. Cl.
CPC ...... *H01L 51/0005* (2013.01); *H01L 27/3211* (2013.01); *H01L 27/3216* (2013.01);
(Continued)

(58) Field of Classification Search
CPC ............. H01L 51/0005; H01L 51/5072; H01L 51/508; H01L 27/3216
(Continued)

(56) References Cited

U.S. PATENT DOCUMENTS

2004/0096570 A1* 5/2004 Weaver ............... H01L 51/0003
427/66
2004/0195965 A1 10/2004 Yamazaki et al.
(Continued)

FOREIGN PATENT DOCUMENTS

CN    1543276 A  * 11/2004
CN    1711001 A    12/2005
(Continued)

OTHER PUBLICATIONS

Office Action in Chinese Application No. 201510130566.0 dated Aug. 3, 2017, with English translation.
(Continued)

*Primary Examiner* — Long K Tran
(74) *Attorney, Agent, or Firm* — Womble Bond Dickinson (US) LLP

(57) ABSTRACT

An organic light emitting diode display panel, a manufacturing method thereof and a display device are disclosed, for reducing the number of inkjet heads used in inkjet printing or alleviating the swath mura at printing interfaces. The method comprises manufacturing an anode layer, a light emitting layer and a cathode layer on a base substrate, and the method can further comprise manufacturing by an entire-surface coating process a function layer having a first preset thickness between the anode layer and the light emitting layer; and in a first preset region of the function layer that has been manufactured, manufacturing by an inkjet printing process a function layer having a second preset thickness.

20 Claims, 6 Drawing Sheets

(51) Int. Cl.
*H01L 27/32* (2006.01)
*H01L 51/50* (2006.01)

(52) U.S. Cl.
CPC ...... *H01L 51/0004* (2013.01); *H01L 51/0097* (2013.01); *H01L 51/5056* (2013.01); *H01L 51/5072* (2013.01); *H01L 51/5088* (2013.01); *H01L 51/56* (2013.01); *H01L 2251/558* (2013.01)

(58) Field of Classification Search
USPC ........................................ 257/40; 438/82, 99
See application file for complete search history.

(56) References Cited

U.S. PATENT DOCUMENTS

| 2005/0280355 | A1 | 12/2005 | Lee et al. |
| 2007/0138483 | A1 | 6/2007 | Lee et al. |
| 2010/0045176 | A1* | 2/2010 | Kim ................... H01L 51/5234 313/504 |
| 2010/0045189 | A1* | 2/2010 | Storch ................ H01L 51/50 315/149 |
| 2014/0134781 | A1 | 5/2014 | Steirer et al. |

FOREIGN PATENT DOCUMENTS

| CN | 1986645 A | 6/2007 |
| CN | 103647026 A | 3/2014 |
| CN | 104716162 A | 6/2015 |

OTHER PUBLICATIONS

Office Action in Chinese Application No. 201510130566.0 dated Sep. 21, 2017, with English translation.
International Search Report and Written Opinion in PCT/CN2016/075622 with English translation. 16 pages.
Office Action in Chinese Application No. 201510130566.0 dated Mar. 3, 2017, with English translation. 10 pages.

* cited by examiner

OLED DISPLAY PANEL, MANUFACTURING METHOD THEREOF AND DISPLAY DEVICE

RELATED APPLICATIONS

The present application is the U.S. national phase entry of PCT/CN2016/075622, with an international filling date of Mar. 4, 2016, which claims the benefit of Chinese Patent Application NO. 201510130566.0, filed on Mar. 24, 2015, the entire disclosure of which is incorporated herein by reference.

FIELD OF THE INVENTION

The present invention relates to the field of display technologies, and in particular to an organic light emitting diode (OLED) display panel, a manufacturing method thereof and a display device.

BACKGROUND

As compared with a liquid crystal display (LCD), an organic light emitting diode (OLED) display has many advantages such as self-illumination, response rapidity, wide view-angle, high brightness, vivid color, light weight and thin thickness, and thus it is deemed to represent the display technologies of the next generation.

In the prior art, for an organic electroluminescent device OLED, there are mainly two ways of fabricating an organic thin film therein:

A. a vacuum evaporation method, suitable for organic small molecules, characterized in that the formation of the organic thin film does not require a solvent and the thickness of the thin film is uniform, but it is not suitable for the production of large-sized products because of heavy device investment and low utilization rate of materials.

B. a solution process, comprising spin coating, inkjet printing, nozzle coating and so on, appropriate for polymeric materials and soluble small molecules, characterized by low device cost, so it is prominently advantageous in the production of large-scaled or large-sized products.

During the manufacture of a hole injection layer and a hole transport layer of an organic light emitting diode display panel, inkjet printing of the solution process is adopted in the prior art, because inkjet printing, as the most important technique of the solution process, has advantages such as low cost, unlimited dimension, and full color implementation. However, in a situation where an inkjet printing process is performed on a large-sized organic light emitting diode display panel, if inkjet printing is performed only once on a large-sized substrate, a great number of inkjet heads will be needed, which will make it difficult to calibrate jet volumes of all inkjet heads; if inkjet printing is performed multiple times by using a small number of inkjet heads, swath mura will occur at printing interfaces.

To sum up, in the prior art, when a hole injection layer or a hole transport layer of an organic light emitting diode display panel is manufactured by an inkjet printing process, a great number of inkjet heads will be required, or swath mura may be caused at printing interfaces.

SUMMARY

Embodiments of the present invention provide an organic light emitting diode display panel, a manufacturing method thereof and a display device, for reducing the number of inkjet heads used in inkjet printing or alleviating the swath mura at printing interfaces.

A manufacturing method of an organic light emitting diode display panel provided in an embodiment of the invention comprises manufacturing an anode layer, a light emitting layer and a cathode layer on a base substrate. The method further comprises manufacturing by an entire-surface coating process a function layer having a first preset thickness between the anode layer and the light emitting layer; and manufacturing by an inkjet printing process a function layer having a second preset thickness in a first preset region of the function layer having the first preset thickness.

In the embodiments of the present invention, the function layer mentioned above comprises but is not limited to a hole transport layer or a hole injection layer. A function layer such as a hole transport layer and a hole injection layer can facilitate transport of carriers in the OLED.

For the manufacturing method of an organic light emitting diode display panel provided in the embodiments of the present invention, the method comprises manufacturing by an entire-surface coating process a function layer having a first preset thickness between the anode layer and the light emitting layer; and then in a first preset region of the function layer that has been manufactured, manufacturing by an inkjet printing process a function layer having a second preset thickness; in other words, the function layer is manufactured by combining the entire-surface coating and inkjet printing techniques. Entire-surface coating can satisfy a minimum thickness of a function layer as actually desired and create an ambient atmosphere for solvent volatilization on an entire surface; whereas inkjet printing can form function layers having different thicknesses. In contrast with the prior art, the embodiments of the invention can reduce the number of inkjet heads used in inkjet printing and alleviate the swath mura at printing interfaces.

In an embodiment, the function layer can be a hole injection layer. The manufacturing method can comprise steps as follows:

manufacturing by an entire-surface coating process a hole injection layer having a first preset thickness between the anode layer and the light emitting layer; and in a first preset region of the hole injection layer that has been manufactured, manufacturing by an inkjet printing process a hole injection layer having a second preset thickness. The manufacturing method can further comprise the following steps: manufacturing by an entire-surface coating process a hole transport layer having a third preset thickness between the light emitting layer and an integrated hole injection layer comprising both the hole injection layer having the first preset thickness and the hole injection layer having the second thickness; in a second preset region of the hole transport layer that has been manufactured, manufacturing by an inkjet printing process a hole transport layer having a fourth preset thickness. In this way, a display panel comprising both a hole injection layer and a hole transport layer can be manufactured.

In an embodiment, the organic light emitting diode display panel comprises an R pixel region, a G pixel region and a B pixel region, the thickness of the hole injection layer corresponding to the R pixel region being a fifth preset thickness, and the thickness of the hole injection layer corresponding to the G pixel region being a sixth preset thickness, and the thickness of the hole injection layer corresponding to the B pixel region being a seventh preset thickness, wherein the fifth preset thickness is smaller than the sixth preset thickness, and the sixth preset thickness is smaller than the seventh preset thickness.

Further, manufacturing an integrated hole injection layer can comprise steps as follows:

manufacturing by an entire-surface coating process a hole injection layer having the fifth preset thickness between the anode layer and the light emitting layer, the fifth preset thickness being namely the first preset thickness; manufacturing by an inkjet printing process a hole injection layer in a region corresponding to the G pixel region on the hole injection layer having the fifth preset thickness such that the thickness of the hole injection layer in the region corresponding to the G pixel region is the sixth preset thickness; manufacturing by an inkjet printing process a hole injection layer in a region corresponding to the B pixel region on the hole injection layer having the fifth preset thickness such that the thickness of the hole injection layer in the region corresponding to the B pixel region is the seventh preset thickness.

Similarly, in this embodiment, manufacturing an integrated hole injection layer may comprise steps as follows: manufacturing by an entire-surface coating process a hole injection layer having the fifth preset thickness between the anode layer and the light emitting layer, the fifth preset thickness being namely the first preset thickness; manufacturing by an inkjet printing process a hole injection layer in both a region corresponding to the G pixel region and a region corresponding to the B pixel region on the hole injection layer having the fifth preset thickness such that the thickness of the hole injection layer in both the region corresponding to the G pixel region and the region corresponding to the B pixel region is the sixth preset thickness; manufacturing by an inkjet printing process a hole injection layer in a region corresponding to the B pixel region on the hole injection layer having the sixth preset thickness such that the thickness of the hole injection layer in the region corresponding to the B pixel region is the seventh preset thickness.

In another embodiment, the function layer may comprise only a hole transport layer. The organic light emitting diode display panel comprises an R pixel region, a G pixel region and a B pixel region, the thickness of the hole transport layer corresponding to the R pixel region being an eighth preset thickness, the thickness of the hole transport layer corresponding to the G pixel region being a ninth preset thickness, and the thickness of the hole transport layer corresponding to the B pixel region being a tenth preset thickness. The eighth preset thickness is smaller than the ninth preset thickness, and the ninth preset thickness is smaller than the tenth preset thickness.

Further, manufacturing an integrated hole transport layer can comprise steps as follows: manufacturing by an entire-surface coating process a hole transport layer having the eighth preset thickness between the anode layer and the light emitting layer; manufacturing by an inkjet printing process a hole transport layer in a region corresponding to the G pixel region on the hole transport layer having the eighth preset thickness such that the thickness of the hole transport layer in the region corresponding to the G pixel region is the ninth preset thickness; manufacturing by an inkjet printing process a hole transport layer in a region corresponding to the B pixel region on the hole transport layer having the eighth preset thickness such that the thickness of the hole injection layer in the region corresponding to the B pixel region is the tenth preset thickness.

Alternatively, in another embodiment, manufacturing an integrated hole transport layer can comprise steps as follows:

manufacturing by an entire-surface coating process a hole transport layer having the eighth preset thickness between the anode layer and the light emitting layer; manufacturing by an inkjet printing process a hole transport layer in both a region corresponding to the G pixel region and a region corresponding to the B pixel region on the hole transport layer having the eighth preset thickness such that the thickness of the hole transport layer in both the region corresponding to the G pixel region and the region corresponding to the B pixel region is the ninth preset thickness; manufacturing by an inkjet printing process a hole transport layer in a region corresponding to the B pixel region on the hole transport layer having the ninth preset thickness such that the thickness of the hole transport layer in the region corresponding to the B pixel region is the tenth preset thickness.

According to yet another embodiment of the present invention, the organic light emitting diode display panel comprises an R pixel region, a G pixel region and a B pixel region, the thickness of the hole transport layer corresponding to the R pixel region being an eleventh preset thickness, and the thickness of the hole transport layer corresponding to the G pixel region being a twelfth preset thickness, and the thickness of the hole transport layer corresponding to the B pixel region being a thirteenth preset thickness. The eleventh preset thickness is greater than the twelfth preset thickness, and the twelfth preset thickness is greater than the thirteenth preset thickness. And manufacturing an integrated hole transport layer comprises steps as follows: manufacturing by an entire-surface coating process a hole transport layer having the thirteenth preset thickness between the light emitting layer and an integrated hole injection layer comprising both a hole injection layer having the first preset thickness and a hole injection layer having the second preset thickness; manufacturing by an inkjet printing process a hole transport layer in a region corresponding to the G pixel region on the hole transport layer having the thirteenth preset thickness such that the thickness of the hole transport layer in the region corresponding to the G pixel region is the twelfth preset thickness; manufacturing by an inkjet printing process a hole transport layer in a region corresponding to the R pixel region on the hole transport layer having the thirteenth preset thickness such that the thickness of the hole transport layer in the region corresponding to the R pixel region is the eleventh preset thickness.

Alternatively, in still another embodiment, manufacturing an integrated hole transport layer comprises steps as follows: manufacturing by an entire-surface coating process a hole transport layer having the thirteenth preset thickness between the light emitting layer and an integrated hole injection layer comprising both a hole injection layer having the first preset thickness and a hole injection layer having the second preset thickness; manufacturing by an inkjet printing process a hole transport layer in both a region corresponding to the G pixel region and a region corresponding to the R pixel region on the hole transport layer having the thirteenth preset thickness such that the thickness of the hole transport layer in both the region corresponding to the G pixel region and the region corresponding to the R pixel region is the twelfth preset thickness; manufacturing by an inkjet printing process a hole transport layer in a region corresponding to the R pixel region on the hole transport layer having the twelfth preset thickness such that the thickness of the hole transport layer in the region corresponding to the R pixel region is the eleventh preset thickness.

Further, the method can further comprise manufacturing an electron transport layer between the light emitting layer and the cathode layer.

Further, the method can further comprise manufacturing an electron injection layer between the cathode layer and the electron transport layer.

Further, the entire-surface coating process may comprise electrostatic scattering coating or slot die coating.

Further, the base substrate can be a glass substrate or a flexible substrate.

A further embodiment of the present invention further provides an organic light emitting diode display panel, the organic light emitting diode display panel being one manufactured by using the method in any of the above embodiments.

Still another embodiment of the present invention further provides a display device, which may comprise the organic light emitting diode display panel mentioned above.

DETAILED DESCRIPTION OF EMBODIMENTS

The embodiments of the present invention provide an organic light emitting diode display panel, a manufacturing method thereof and a display device, for reducing the number of inkjet heads used in inkjet printing and alleviating the swath mura at printing interfaces.

In order to render the objective, the technical solutions and advantages of the disclosure clearer, the embodiments of the invention will be further described in detail as follows with reference to the drawings. Apparently, the described embodiments are only part of the embodiments of the present invention, rather than the all possible embodiments. Based on the described embodiments, all other embodiments obtained by those having an ordinary skill in the art without inventive efforts shall fall within the scope of the present invention.

The organic light emitting diode display panel and the manufacturing method thereof provided by the embodiments of the present invention will be introduced in detail as follows with reference to the drawings.

Figure 1:
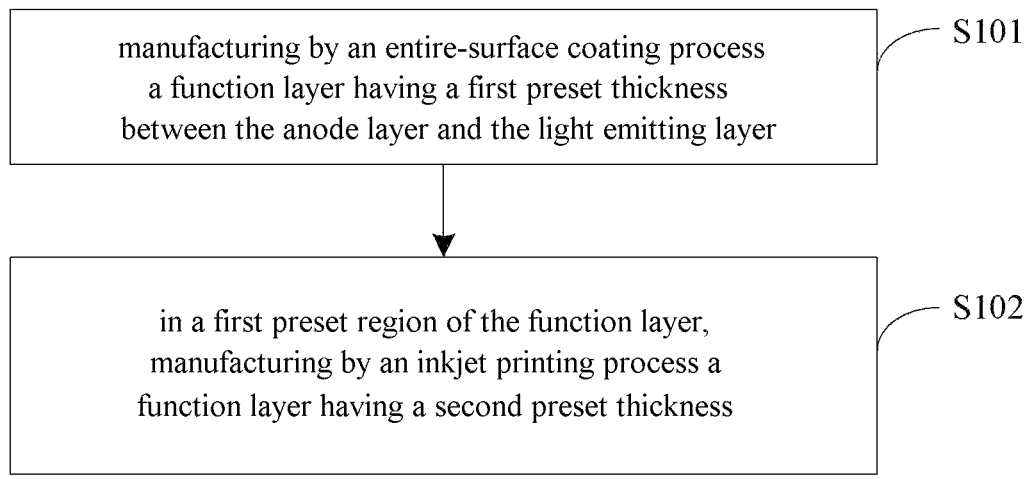
FIG. 1 is a flowchart of a method for manufacturing a function layer during the manufacture of an organic light emitting diode display panel provided in an embodiment of the present invention.

Referring to FIG. 1, the embodiments of the present invention provide a manufacturing method of an organic light emitting diode display panel, the method comprising manufacturing an anode layer, a light emitting layer and a cathode layer on a base substrate, the method further comprises the steps as follows: S101: manufacturing by an entire-surface coating process a function layer having a first preset thickness between the anode layer and the light emitting layer; S102: in a first preset region of the function layer, manufacturing by an inkjet printing process a function layer having a second preset thickness.

The function layer in the embodiments of the present invention comprises a hole transport layer and/or a hole injection layer, in other words, the function layers can only comprise either a hole injection layer or a hole transport layer, alternatively, the function layers of the organic light emitting diode display panel can also comprise both a hole injection layer and a hole transport layer.

In case the function layer comprises only a hole injection layer, the manufacturing method of an organic light emitting diode display panel provided in an embodiment of the present invention may comprise the following steps: manufacturing by an entire-surface coating process a hole injection layer having a first preset thickness between the anode layer and the light emitting layer; in a first preset region of the hole injection layer that has been manufactured, manufacturing by an inkjet printing process a hole injection layer having a second preset thickness.

When the function layer comprises only a hole transport layer, the manufacturing method of an organic light emitting diode display panel provided in an embodiment of the present invention may comprise the following steps: manufacturing by an entire-surface coating process a hole transport layer having a first preset thickness between the anode layer and the light emitting layer; in a first preset region of the hole transport layer that has been manufactured, manufacturing by an inkjet printing process a hole transport layer having a second preset thickness.

In case the function layers comprise both a hole transport layer and a hole injection layer, the manufacturing method of an organic light emitting diode display panel provided in an embodiment of the present invention may comprise steps of manufacturing by an entire-surface coating process a hole injection layer having a first preset thickness between the anode layer and the light emitting layer, and in a first preset region of the hole injection layer that has been manufactured, manufacturing by an inkjet printing process a hole injection layer having a second preset thickness. In this case, the manufacturing method may further comprise:

manufacturing by an entire-surface coating process a hole transport layer having a third preset thickness between the light emitting layer and an integrated hole injection layer comprising both the hole injection layer having the first preset thickness and the hole injection layer having the second thickness; in a second preset region of the hole transport layer that has been manufactured, manufacturing by an inkjet printing process a hole transport layer having a fourth preset thickness.

In specific implementation, the values of the first preset thickness and the second preset thickness of the function layer (i.e., a hole injection layer or a hole transport layer) that has been manufactured can be predetermined according to a structural requirement of the organic light emitting diode display panel, and the first preset region in the embodiment of the invention is a region corresponding to the second preset thickness. During a practical production, the first preset thickness can be equated with the second preset thickness. Certainly, the values of the first preset thickness and the second preset thickness can also be unequal. If the value of the second preset thickness is zero, it is only necessary to form by an entire-surface coating process a hole injection layer or a hole transport layer having an equal thickness between the anode layer and the light emitting layer.

Of course, during an actual production, the thicknesses of the hole injection layer or the hole transport layer to be manufactured may take different values. In this case, a hole injection layer or a hole transport layer having a minimum thickness value is firstly formed by an entire-surface coating process between the anode layer and the light emitting layer, and then a hole injection layer or a hole transport layer having different thicknesses upon needs are then manufactured on the hole injection layer or the hole transport layer by an inkjet printing process. The entire-surface coating process in the embodiments of the invention can satisfy a minimum thickness of a hole injection layer or a hole transport layer as actually desired and create an ambient atmosphere for solvent volatilization on an entire surface; when inkjet printing is performed after that, since the ambient atmosphere for solvent volatilization on the entire surface is the same, the swath mura at printing interfaces in inkjet printing can be alleviated.

Besides, the second preset region mentioned in the embodiment of the invention is a region corresponding to the fourth preset thickness, and the second preset region in the embodiment of the invention can be located in a same position as the first preset region. The values of the third preset thickness and the fourth preset thickness in the embodiment of the invention can also be predetermined according to the structural requirement of the organic light emitting diode display panel.

In another embodiment, in order to enhance the light emitting effect of the organic light emitting diode display panel, the manufacturing method of an organic light emitting diode display panel can further comprise manufacturing an electron transport layer between the light emitting layer and the cathode layer.

Further, in order to enhance the light emitting effect of the organic light emitting diode display panel, the manufacturing method of an organic light emitting diode display panel can further comprise manufacturing an electron injection layer between the cathode layer and the electron transport layer.

The structure of the organic light emitting diode display panel provided in the embodiments of the invention will be further introduced in detail as follows with reference to the drawings.

Shapes and sizes of the film layers in the drawings do not reflect the true proportion of the organic light emitting diode display panel, but only represent a partial structure of the organic light emitting diode display panel for the only purpose of illustrating the embodiments of the invention.

Figure 2:
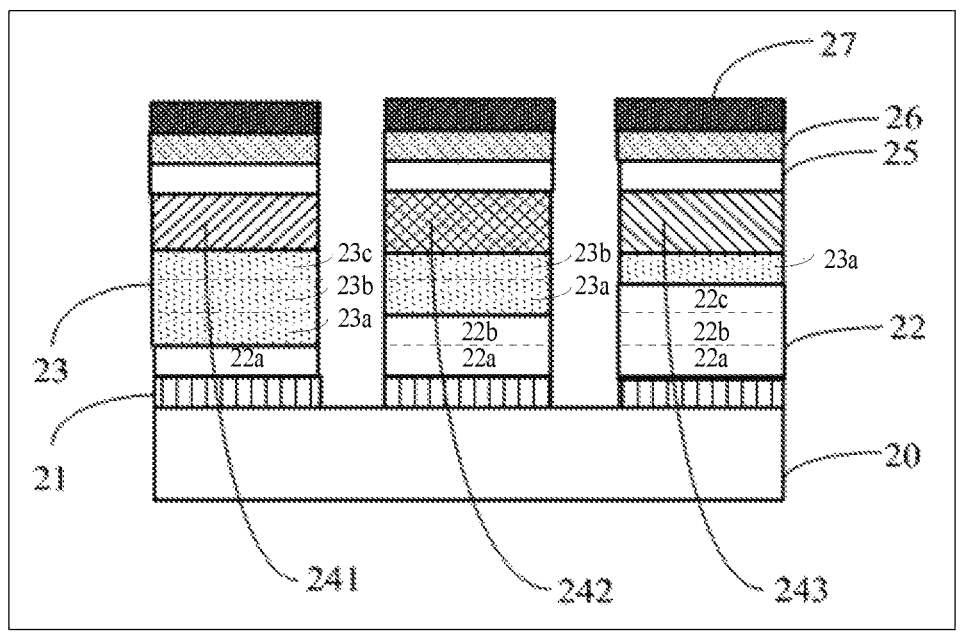
FIG. 2 is a cross-sectional structural view of an organic light emitting diode display panel provided in an embodiment of the present invention.

Referring to FIG. 2, an organic light emitting diode display panel provided in an embodiment of the invention may comprise a base substrate 20, an anode layer 21 on the base substrate 20, a hole injection layer 22 on the anode layer 21, a hole transport layer 23 on the hole injection layer 22, a light emitting layer on the hole transport layer 23, an electron transport layer 25 on the light emitting layer, an electron injection layer 26 on the electron transport layer 25 and a cathode layer 27 on the electron injection layer 26. The organic light emitting diode display panel in the embodiment of the invention may comprise a red (R) pixel region, a green (G) pixel region and a blue (B) pixel region, a light emitting layer corresponding to the R pixel region emits red light in display, the light emitting layer corresponding to this region being R light emitting layer 241, and a light emitting layer corresponding to the G pixel region emits green light in display, the light emitting layer corresponding to the region being G light emitting layer 242, and a light emitting layer corresponding to the B pixel region emits blue light in display, the light emitting layer corresponding to the region being B light emitting layer 243.

During an actual production, the structure of the device may also be an inverted OLED device, i.e., the cathode is arranged on the base substrate. The OLED device in the embodiments of the invention is only introduced by taking an example in which the anode is arranged on the base substrate.

Figure 3:
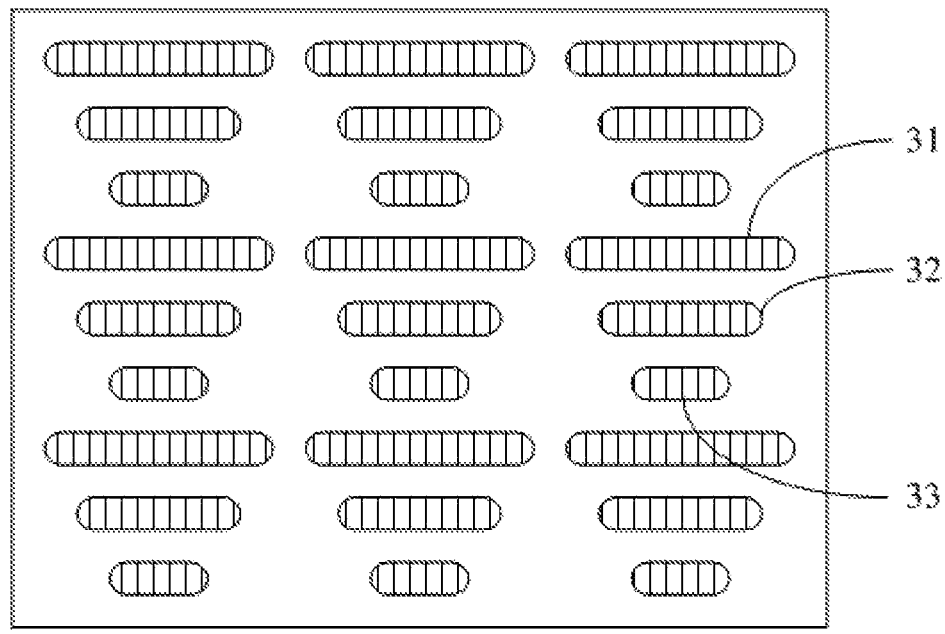
FIG. 3 is a planar structural view of a base substrate on which an anode layer has been manufactured during the manufacture of an organic light emitting diode display panel provided in an embodiment of the present invention.

Referring to FIG. 2 again, an exemplary procedure of manufacturing an organic light emitting diode display panel according to the embodiment of the invention will be specifically introduced as follows. Firstly, an anode layer 21 is manufactured on a base substrate 20. The base substrate 20 in the embodiment of the invention can be a glass substrate, or a flexible substrate; the anode layer 21 can be a single film of indium tin oxide (ITO) or indium zinc oxide (IZO), alternatively, it may be a composite film of indium tin oxide and indium zinc oxide. Certainly, during an actual manufacture, the anode can also be made of a metallic material. According to the embodiment of the invention, the anode layer 21 can be manufactured on the base substrate 20 by magnetron sputtering. The specific process for manufacturing the anode layer 21 can be the same as that in the prior art, which will not be expounded for simplicity. FIG. 3 illustrates a planar view of a base substrate on which an anode layer has been manufactured according to an embodiment of the invention, in which region 31 represents a region corresponding to the R pixel region, region 32 represents a region corresponding to the G pixel region, and region 33 represents a region corresponding to the B pixel region.

As for embodiments involving full-color inkjet printing, prior to the manufacture of a hole injection layer, it is necessary to firstly manufacture a pixel defining layer for restricting flow of an inkjet printing solution.

The pixel defining layer can be formed by either inorganics such as silicon dioxide or silicon nitride, or organics such as acryl resin or polyimide resin. When the pixel defining layer is manufactured using an inorganic material, a plasma enhanced chemical vapor deposition process is usually adopted, which can comprise steps as follows: spin coating the inorganic material layer with photoresist, patterning the photoresist by exposure and developing, etching the inorganic material layer by dry etching, stripping the remaining photoresist, and thereby an inorganic pixel defining layer is manufactured. The method of forming a pixel defining layer by an organic material can comprise steps as follows: spin coating or slot die coating the anode layer with photoresist, patterning the photoresist by direct exposure and developing, and thereby an organic pixel defining layer is manufactured. It can be understood that the formed pixel defining layer can separate each sub-pixel, and the pixel defining layer is not shown in FIG. 2 for simplicity.

Next, the hole injection layer and the hole transport layer are to be manufactured. The manufacture process can comprise steps as follows: manufacturing by an entire-surface coating process a hole injection layer 22a having a first preset thickness between the anode layer 21 and the light emitting layer; and in a first preset region of the hole injection layer 22a that has been manufactured, manufacturing by an inkjet printing process a hole injection layer 22b having a second preset thickness; manufacturing by an entire-surface coating process a hole transport layer 23a having a third preset thickness between the light emitting layer and an integrated hole injection layer comprising both the hole injection layer 22a having the first preset thickness and the hole injection layer 22b having the second thickness; in a second preset region of the hole transport layer 23a that has been manufactured, manufacturing by an inkjet printing process a hole transport layer 23b having a fourth preset thickness. By doing this, a display panel comprising both a hole injection layer 22 and a hole transport layer 23 can be manufactured. FIG. 2 also shows a hole injection layer 22c and a hole transport layer 23c for explaining other embodiments according to the invention, which will be described below.

Actually, the thickness value of the hole injection layer 22 can be preset in light of the structural requirement of the organic light emitting diode display panel. In an embodiment of the invention, assuming the thickness of the hole injection layer corresponding to the R pixel region is a fifth preset thickness, the thickness of the hole injection layer corresponding to the G pixel region is a sixth preset thickness, and the thickness of the hole injection layer corresponding to the B pixel region is a seventh preset thickness, the fifth preset thickness may be smaller than the sixth preset thickness, and the sixth preset thickness may be smaller than the seventh preset thickness. For example, the thickness of the hole injection layer corresponding to the R pixel region can be 30 nm, the thickness of the hole injection layer corresponding to the G pixel region can be 40 nm and the thickness of the hole injection layer corresponding to the B pixel region can be 50 nm. The thicknesses of the hole injection layers corresponding to different pixel regions can be determined based on a wavelength of light emission of the different pixel regions so as to improve the light transmission efficiency. Apparently, the determination of the thicknesses of the hole injection layer corresponding to the R pixel region, the hole injection layer corresponding to the G pixel region and the hole injection layer corresponding to the B pixel region is not limited to the embodiments described herein.

In an embodiment of the invention, a hole injection layer is manufactured by using two exemplary methods as follows.

Figure 4A:
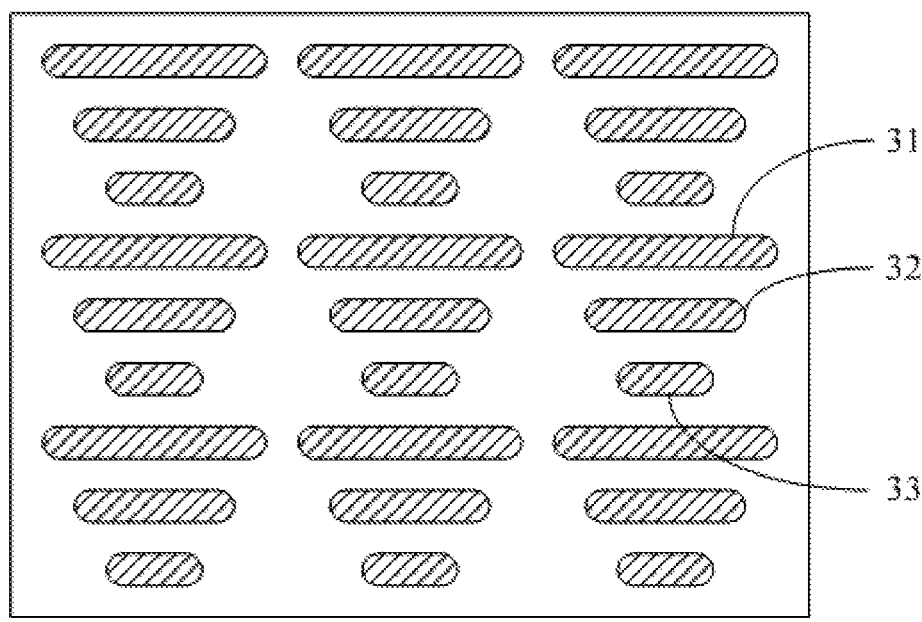
FIGS. 4(a)-4(c) are respectively planar structural views of different phases during the manufacture of a hole injection layer by using a manufacturing method provided in an embodiment of the present invention.

In an example, manufacturing an integrated hole injection layer can comprise steps as follows: manufacturing by an entire-surface coating process a hole injection layer 22a having a fifth preset thickness between the anode layer 21 and the light emitting layer (it can be understood that the fifth preset thickness mentioned here may correspond to the first preset thickness mentioned above); manufacturing by an inkjet printing process a hole injection layer 22b in a region corresponding to the G pixel region on the hole injection layer 22a having the fifth preset thickness such that the thickness of the hole injection layer in the region corresponding to the G pixel region is a sixth preset thickness (e.g., the sum of the thicknesses of the hole injection layer 22a and the hole injection layer 22b); manufacturing by an inkjet printing process hole injection layers 22b and 22c in a region corresponding to the B pixel region on the hole injection layer 22a having the fifth preset thickness such that the thickness of the hole injection layer in the region corresponding to the B pixel region is a seventh preset thickness (e.g., the sum of the thicknesses of the hole injection layers 22a, 22b and 22c). As shown in FIG. 4(a), in an embodiment of the present invention, a hole injection layer having a thickness of 30 nm can be formed by an entire-surface coating process on the base substrate on which the anode layer has been manufactured. The entire-surface coating process adopted in the embodiments of the present invention can comprise electrostatic scattering coating or slot die coating. Of course, an entire-surface coating process of other types can be further adopted during the actual production. Entire-surface coating is a very mature method, so the hole injection layer manufactured by an entire-surface coating process in the embodiments of the invention has excellent performances. At this time, the manufacture of the hole injection layer corresponding to the R pixel region has been accomplished, and a hole injection layer corresponding to the G pixel region is to be manufactured so as to increase the thickness by 10 nm, and a hole injection layer corresponding to the B pixel region is to be manufactured so as to increase the thickness by 20 nm.

Figure 4B:
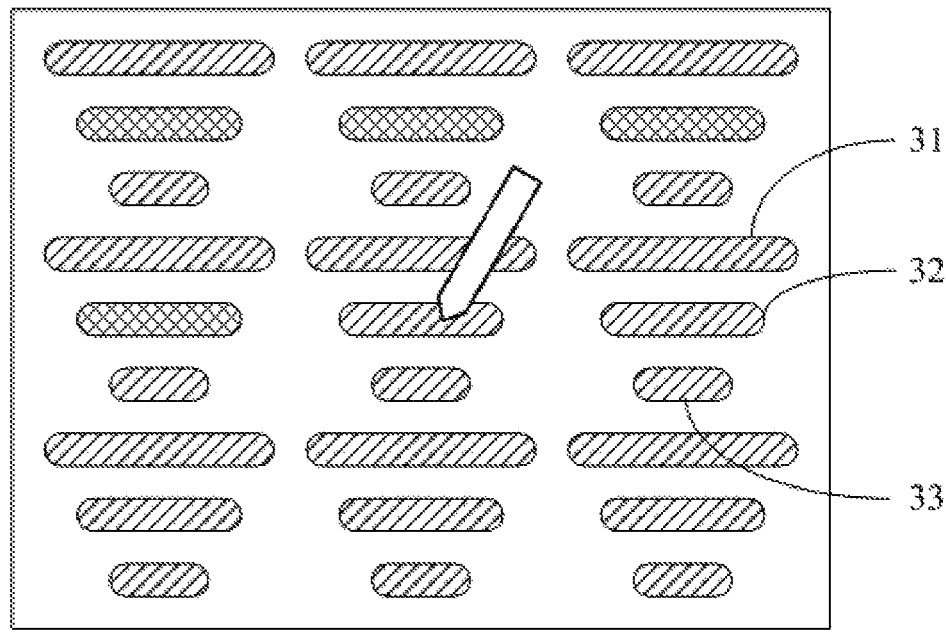
Figure 4C:
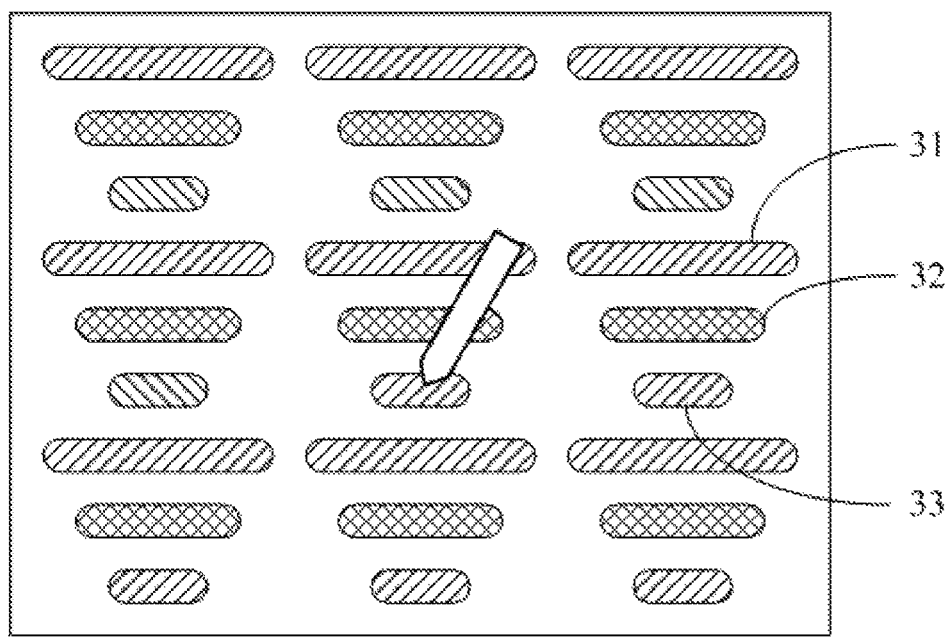

As shown in FIG. 4(b), for an embodiment of the invention, a hole injection layer having a thickness of 10 nm can be manufactured by an inkjet printing process in a region corresponding to the G pixel region on the base substrate as shown in FIG. 4(a) such that the thickness of the hole injection layer in the region corresponding to the G pixel region is 40 nm, and thereby the manufacture of the hole injection layer corresponding to the G pixel region is accomplished. Next, as shown in FIG. 4(c), a hole injection layer having a thickness of 20 nm can be manufactured by an inkjet printing process in a region corresponding to the B pixel region on the base substrate as shown in FIG. 4(b) such that the thickness of the hole injection layer in the region corresponding to the B pixel region is 50 nm, and thereby the manufacture of the hole injection layer corresponding to the B pixel region is accomplished. In FIGS. 4(b) and 4(c), a blank block with a tapered end indicates an execution of inkjet printing.

Alternatively, according to another embodiment of the present invention, manufacturing an integrated hole injection layer may comprise steps as follows: manufacturing by an entire-surface coating process a hole injection layer 22a having a fifth preset thickness between the anode layer 21 and the light emitting layer, the fifth preset thickness mentioned here may correspond to the first preset thickness mentioned above; manufacturing by an inkjet printing process a hole injection layer 22b in both a region corresponding to the G pixel region and a region corresponding to the B pixel region on the hole injection layer 22a having the fifth preset thickness such that the thicknesses of the hole injection layers in both the region corresponding to the G pixel region and the region corresponding to the B pixel region is a sixth preset thickness (e.g., the sum of the thicknesses of the hole injection layer 22a and the hole injection layer 22b); manufacturing by an inkjet printing process a hole injection layer 22c in a region corresponding to the B pixel region on the hole injection layer having the sixth preset thickness such that the thickness of the hole injection layer in the region corresponding to the B pixel region is a seventh preset thickness (e.g., the sum of the thicknesses of the hole injection layers 22a, 22b and 22c).

Similarly, in a specific example, like in the method described in the embodiment mentioned above, a hole injection layer having a thickness of 30 nm can be manufactured in a starting phase by an entire-surface coating process on the base substrate on which the anode layer has been manufactured. The step can be the same as the step as shown in FIG. 4(a) in the embodiment mentioned above, which will not be expounded for simplicity. At this step, the manufacture of a hole injection layer corresponding to the R pixel region is accomplished.

Figure 5A:
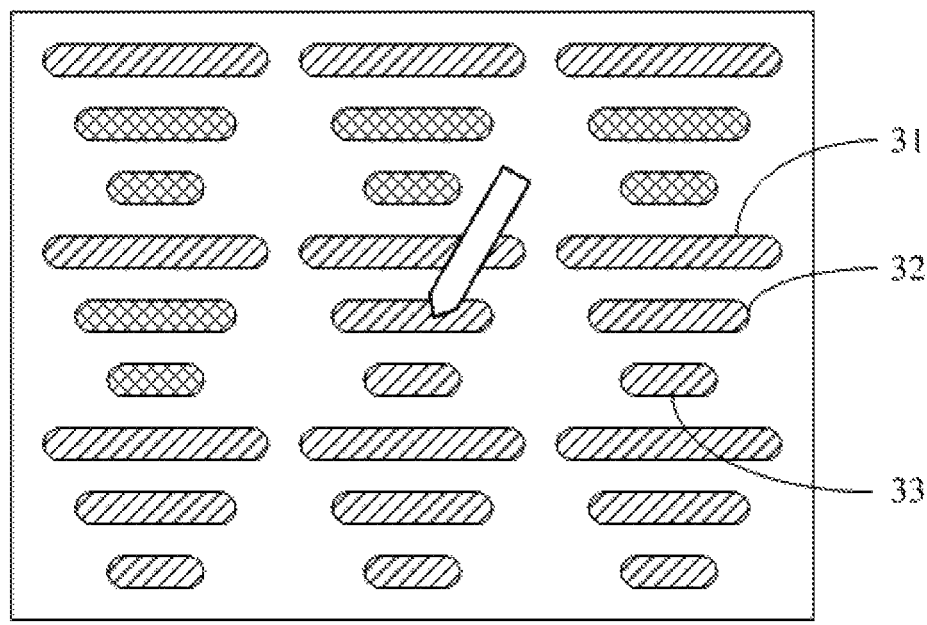
FIGS. 5(a)-5(b) are respectively planar structural views of different phases during the manufacture of a hole injection layer by using a manufacturing method provided in another embodiment of the present invention.
Figure 5B:
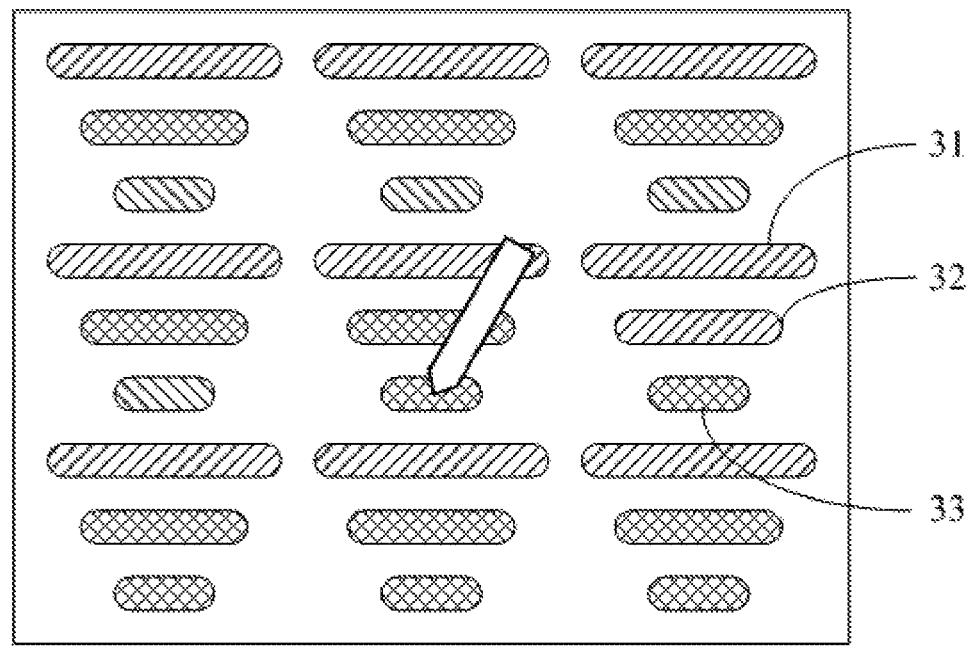

Then, as shown in FIG. 5(a), a hole injection layer having a thickness of 10 nm may be manufactured by an inkjet printing process in both a region corresponding to the G pixel region and a region corresponding to the B pixel region on the base substrate as shown in FIG. 4(a) such that the thickness of the hole injection layer in both the region corresponding to the G pixel region and the region corresponding to the G pixel region is 40 nm, and thereby the manufacture of the hole injection layer corresponding to the G pixel region is accomplished. Next, as shown in FIG. 5(b), a hole injection layer having a thickness of 10 nm is manufactured by an inkjet printing process in a region corresponding to the B pixel region on the base substrate as shown in FIG. 5(a) such that the thickness of the hole injection layer in the region corresponding to the B pixel region is 50 nm, and thereby the manufacture of the hole injection layer corresponding to the B pixel region is accomplished. Likewise, in FIGS. 5(a) and 5(b), a blank block with a tapered end indicates an execution of inkjet printing.

Figure 6:
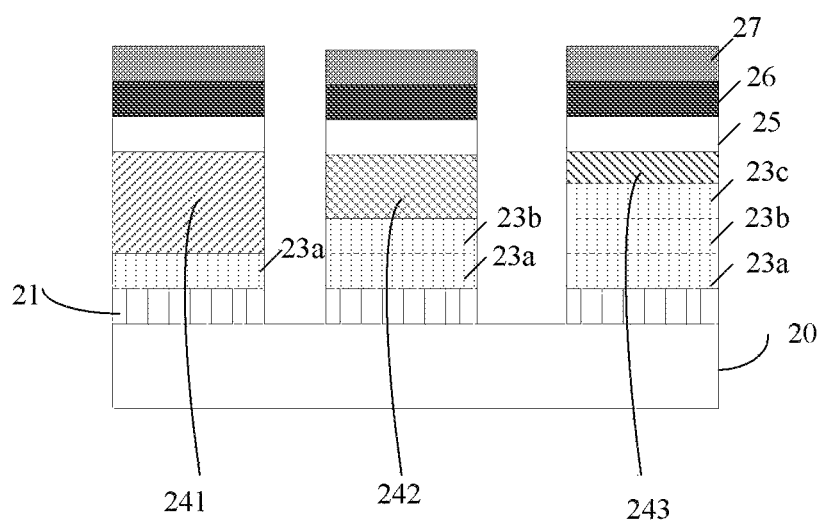
FIG. 6 illustrates a partial cross-sectional structural view of an organic light emitting diode display panel having only a hole transport layer manufactured as the function layer according to an embodiment of the present invention.

As mentioned above, the function layer mentioned herein may comprise either a hole injection layer or a hole transport layer. FIG. 6 shows an example of an OLED display panel in which only a hole transport layer is manufactured.

In the example as shown in FIG. 6, the function layer comprises only a hole transport layer. The organic light emitting diode display panel comprises an R pixel region, a G pixel region and a B pixel region, the thickness of the hole transport layer 23a corresponding to the R pixel region being an eighth preset thickness, the thickness of the hole transport layers 23a and 23b corresponding to the G pixel region being a ninth preset thickness, and the thickness of the hole transport layers 23a, 23b and 23c corresponding to the B pixel region being a tenth preset thickness. The eighth preset thickness is smaller than the ninth preset thickness, and the ninth preset thickness is smaller than the tenth preset thickness.

In this embodiment, manufacturing an integrated hole transport layer may comprise steps as follows:

manufacturing by an entire-surface coating process a hole transport layer 23a having an eighth preset thickness between the anode layer 21 and the light emitting layer; manufacturing by an inkjet printing process a hole transport layer 23b in a region corresponding to the G pixel region on the hole transport layer 23a having the eighth preset thickness such that the thickness of the hole transport layer in the region corresponding to the G pixel region is a ninth preset thickness; manufacturing by an inkjet printing process hole transport layers 23b and 23c in a region corresponding to the B pixel region on the hole transport layer having the eighth preset thickness such that the thickness of the hole injection layer in the region corresponding to the B pixel region is a tenth preset thickness.

Alternatively, manufacturing an integrated hole transport layer may comprise steps as follows:

manufacturing by an entire-surface coating process a hole transport layer 23a having an eighth preset thickness between the anode layer 21 and the light emitting layer; manufacturing by an inkjet printing process a hole transport layer 23b in both a region corresponding to the G pixel region and a region corresponding to the B pixel region on the hole transport layer 23a having the eighth preset thickness such that the thicknesses of the hole transport layers in both the region corresponding to the G pixel region and the region corresponding to the B pixel region are a ninth preset thickness (e.g., the sum of thicknesses of the hole transport layer 23a and the hole transport layer 23b); manufacturing by an inkjet printing process a hole transport layer 23c in a region corresponding to the B pixel region on the hole transport layer having the ninth preset thickness such that the thickness of the hole transport layer in the region corresponding to the B pixel region is a tenth preset thickness (e.g., the sum of thicknesses of the hole transport layers 23a, 23b and 23c).

Figure 7:
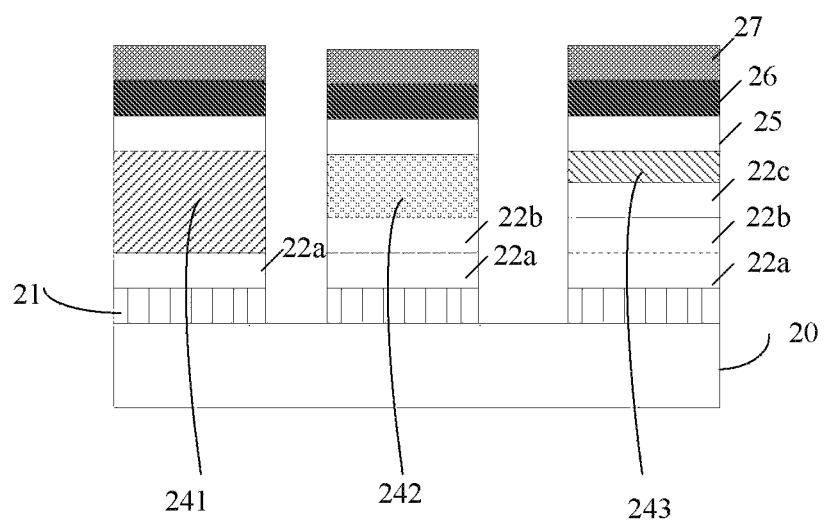
FIG. 7 illustrates a partial cross-sectional structural view of an organic light emitting diode display panel having only a hole injection layer manufactured as the function layer according to an embodiment of the present invention.

FIG. 7 shows an example of an organic light emitting diode display panel, in which only a hole injection layer is manufactured. The method for manufacturing the hole injection layer can be similar to the method for manufacturing the hole transport layer as explained in the above example, which will not be expounded for simplicity.

As mentioned above, the specific thickness values of the hole injection layer and the hole transport layer can be preset according to the structural requirement of the organic light emitting diode display panel. After a hole transport layer or a hole injection layer having a preset thickness has been manufactured by an entire-surface coating process, an inkjet printing operation can be performed many times upon needs so as to obtain a desired thickness of the hole transport layer or the hole injection layer. In the example as shown in FIG. 2, after an entire-surfacing coating process, an inkjet printing operation can be performed twice. A concise explanation of the manufacture of a hole transport layer 23 after the manufacture of a hole injection layer 22 will be given as follows with reference to FIG. 2.

Assuming the thickness of the hole transport layer corresponding to the R pixel region is an eleventh preset thickness, the thickness of the hole transport layer corresponding to the G pixel region is a twelfth preset thickness, and the thickness of the hole transport layer corresponding to the B pixel region is a thirteenth preset thickness, the eleventh preset thickness is greater than the twelfth preset thickness, and the twelfth preset thickness is greater than the thirteenth preset thickness. Manufacturing an integrated hole transport layer can comprise steps as follows:

manufacturing by an entire-surface coating process a hole transport layer 23a having a thirteenth preset thickness between the light emitting layer and the integrated hole injection layer 22; manufacturing by an inkjet printing process a hole transport layer 23b in a region corresponding to the G pixel region on the hole transport layer 23a having the thirteenth preset thickness such that the thickness of the hole transport layer in the region corresponding to the G pixel region is a twelfth preset thickness (the sum of thicknesses of the hole transport layer 23a and the hole transport layer 23b); manufacturing by an inkjet printing process hole transport layers 23b and 23c in a region corresponding to the R pixel region on the hole transport layer 23a having the thirteenth preset thickness such that the thickness of the hole transport layer in the region corresponding to the R pixel region is an eleventh preset thickness (the sum of thicknesses of the hole transport layers 23a, 23b and 23c).

Alternatively, manufacturing the integrated hole transport layer may comprise steps as follows:

manufacturing by an entire-surface coating process a hole transport layer 23a having a thirteenth preset thickness between the light emitting layer and the integrated hole injection layer 21; manufacturing by an inkjet printing process a hole transport layer 23b in both a region corresponding to the G pixel region and a region corresponding to the R pixel region on the hole transport layer 23a having the thirteenth preset thickness such that the thickness of the hole transport layer in both the region corresponding to the G pixel region and the region corresponding to the R pixel region is a twelfth preset thickness; manufacturing by an inkjet printing process a hole transport layer 23c in a region corresponding to the R pixel region on the hole transport layer having the twelfth preset thickness such that the thickness of the hole transport layer in the region corresponding to the R pixel region is an eleventh preset thickness.

Subsequently, a light emitting layer is manufactured by an inkjet printing process on the base substrate on which the hole transport layer has been manufactured. The method for manufacturing the light emitting layer in the embodiments of the present invention can be the same as that in the prior art, which will not be expounded for simplicity. For this embodiment, prior to the manufacture of the light emitting layer, it is also necessary to manufacture a pixel defining layer for restricting flow of the inkjet printing solution. The manufacture process of the pixel defining layer can be the same as described above, which will not be expounded for simplicity.

Next, an electron transport layer can be manufactured by a vapor plating process on the base substrate on which the light emitting layer has been manufactured. The method for manufacturing the electron transport layer in the embodiments of the present invention can be the same as that in the prior art, which will not be expounded for simplicity. After that, an electron injection layer is manufactured by a vapor plating process on the base substrate on which the electron transport layer has been manufactured. The method for manufacturing the electron injection layer in the embodiments of the present invention can be the same as that in the prior art, which will not be expounded for simplicity. Next, a cathode layer can be manufactured by a vapor plating process on the base substrate on which the electron injection layer has been manufactured. The method for manufacturing the cathode layer in the embodiments of the present invention can be the same as that in the prior art, which will not be expounded for simplicity.

In conclusion, the embodiments of the present invention provide an organic light emitting diode display panel and a manufacturing method thereof. For the manufacturing method, entire-surface coating and inkjet printing techniques are combined in the manufacture of a hole injection layer and/or a hole transport layer, the entire-surface coating can satisfy a minimum thickness of a hole injection layer and/or a hole transport layer as actually desired and create an ambient atmosphere for solvent volatilization on an entire surface, and inkjet printing can meet the requirement of the hole injection layer or the hole transport layer for different thicknesses. As compared with the prior art, the embodiments of the present invention can reduce the number of inkjet heads used in inkjet printing and alleviate the swath mura at printing interfaces.

Obviously, those skilled in the art can make various modifications and variations to the present disclosure without departing from the spirits and scopes of the present invention. Thus if these modifications and variations to the disclosure fall within the scopes of the claims of the present invention and the equivalent techniques thereof, the present invention is intended to include them too.

The invention claimed is:

1. A manufacturing method of an organic light emitting diode display panel, comprising manufacturing an anode layer, a light emitting layer and a cathode layer on a base substrate, wherein the method further comprises:
   manufacturing by an entire-surface coating process a hole injection layer having a first preset thickness between the anode layer and the light emitting layer; and
   manufacturing by an inkjet printing process a hole injection layer having a second preset thickness in a first preset region of the hole injection layer having the first preset thickness,
   wherein an area of the first preset region is smaller than that of an upper surface of the hole injection layer having the first preset thickness, such that different pixel regions of the organic light emitting diode display panel have hole injection layers with different thicknesses.

2. The manufacturing method of an organic light emitting diode display panel according to claim 1,
   wherein the method further comprises:
   manufacturing by an entire-surface coating process a hole transport layer having a third preset thickness between the light emitting layer and an integrated hole injection layer comprising both the hole injection layer having the first preset thickness and the hole injection layer having the second thickness; and
   in a second preset region of the hole transport layer that has been manufactured, manufacturing by an inkjet printing process a hole transport layer having a fourth preset thickness.

3. The manufacturing method of an organic light emitting diode display panel according to claim 2, wherein the organic light emitting diode display panel comprises an R pixel region, a G pixel region and a B pixel region, the thickness of the hole injection layer corresponding to the R pixel region being a fifth preset thickness, the thickness of the hole injection layer corresponding to the G pixel region being a sixth preset thickness, and the thickness of the hole injection layer corresponding to the B pixel region being a seventh preset thickness, wherein the fifth preset thickness is smaller than the sixth preset thickness, and the sixth preset thickness is smaller than the seventh preset thickness.

4. The manufacturing method of an organic light emitting diode display panel according to claim 3, wherein manufacturing the integrated hole injection layer comprises steps as follows:
   manufacturing by an entire-surface coating process a hole injection layer having the fifth preset thickness between the anode layer and the light emitting layer, the fifth preset thickness being the first preset thickness;
   manufacturing by an inkjet printing process a hole injection layer in a region corresponding to the G pixel region on the hole injection layer having the fifth preset thickness such that the thickness of the hole injection layer in the region corresponding to the G pixel region is the sixth preset thickness; and
   manufacturing by an inkjet printing process a hole injection layer in a region corresponding to the B pixel region on the hole injection layer having the fifth preset thickness such that the thickness of the hole injection layer in the region corresponding to the B pixel region is the seventh preset thickness.

5. The manufacturing method of an organic light emitting diode display panel according to claim 3, wherein manufacturing the integrated hole injection layer comprises steps as follows:
   manufacturing by an entire-surface coating process a hole injection layer having the fifth preset thickness between the anode layer and the light emitting layer, the fifth preset thickness being the first preset thickness;
   manufacturing by an inkjet printing process a hole injection layer in both a region corresponding to the G pixel region and a region corresponding to the B pixel region on the hole injection layer having the fifth preset thickness such that the thickness of the hole injection layer in both the region corresponding to the G pixel region and the region corresponding to the B pixel region is the sixth preset thickness; and
   manufacturing by an inkjet printing process a hole injection layer in a region corresponding to the B pixel region on the hole injection layer having the sixth preset thickness such that the thickness of the hole injection layer in the region corresponding to the B pixel region is the seventh preset thickness.

6. A manufacturing method of an organic light emitting diode display panel, comprising manufacturing an anode layer, a light emitting layer and a cathode layer on a base substrate, wherein the method further comprises:
   manufacturing by an entire-surface coating process a hole transport layer having a first preset thickness between the anode layer and the light emitting layer; and
   manufacturing by an inkjet printing process a hole transport layer having a second preset thickness in a first preset region of the hole transport layer having the first preset thickness,
   wherein the organic light emitting diode display panel comprises an R pixel region, a G pixel region and a B pixel region, the thickness of the hole transport layer corresponding to the R pixel region being an eighth preset thickness, the thickness of the hole transport layer corresponding to the G pixel region being a ninth preset thickness, and the thickness of the hole transport layer corresponding to the B pixel region being a tenth preset thickness, wherein the eighth preset thickness is smaller than the ninth preset thickness, and the ninth preset thickness is smaller than the tenth preset thickness.

7. The manufacturing method of an organic light emitting diode display panel according to claim 6, wherein manufacturing an integrated hole transport layer comprises steps as follows:
   manufacturing by an entire-surface coating process a hole transport layer having the eighth preset thickness between the anode layer and the light emitting layer;
   manufacturing by an inkjet printing process a hole transport layer in a region corresponding to the G pixel region on the hole transport layer having the eighth preset thickness such that the thickness of the hole transport layer in the region corresponding to the G pixel region is the ninth preset thickness; and
   manufacturing by an inkjet printing process a hole transport layer in a region corresponding to the B pixel region on the hole transport layer having the eighth preset thickness such that the thickness of the hole injection layer in the region corresponding to the B pixel region is the tenth preset thickness.

8. The manufacturing method of an organic light emitting diode display panel according to claim 6, wherein manufacturing an integrated hole transport layer comprises steps as follows:
   manufacturing by an entire-surface coating process a hole transport layer having the eighth preset thickness between the anode layer and the light emitting layer;
   manufacturing by an inkjet printing process a hole transport layer in both a region corresponding to the G pixel region and a region corresponding to the B pixel region on the hole transport layer having the eighth preset thickness such that the thickness of the hole transport layer in both the region corresponding to the G pixel region and the region corresponding to the B pixel region is the ninth preset thickness; and
   manufacturing by an inkjet printing process a hole transport layer in a region corresponding to the B pixel region on the hole transport layer having the ninth preset thickness such that the thickness of the hole transport layer in the region corresponding to the B pixel region is the tenth preset thickness.

9. The manufacturing method of an organic light emitting diode display panel according to claim 2, wherein the organic light emitting diode display panel comprises an R pixel region, a G pixel region and a B pixel region, the thickness of the hole transport layer corresponding to the R pixel region being an eleventh preset thickness, and the thickness of the hole transport layer corresponding to the G pixel region being a twelfth preset thickness, and the thickness of the hole transport layer corresponding to the B pixel region being a thirteenth preset thickness, wherein the eleventh preset thickness is greater than the twelfth preset thickness, and the twelfth preset thickness is greater than the thirteenth preset thickness, and wherein manufacturing an integrated hole transport layer comprises steps as follows:
   manufacturing by an entire-surface coating process a hole transport layer having the thirteenth preset thickness between the light emitting layer and the integrated hole injection layer comprising both a hole injection layer having the first preset thickness and a hole injection layer having the second preset thickness;
   manufacturing by an inkjet printing process a hole transport layer in a region corresponding to the G pixel region on the hole transport layer having the thirteenth preset thickness such that the thickness of the hole transport layer in the region corresponding to the G pixel region is the twelfth preset thickness; and
   manufacturing by an inkjet printing process a hole transport layer in a region corresponding to the R pixel region on the hole transport layer having the thirteenth preset thickness such that the thickness of the hole transport layer in the region corresponding to the R pixel region is the eleventh preset thickness.

10. The manufacturing method of an organic light emitting diode display panel according to claim 2, wherein the organic light emitting diode display panel comprises an R pixel region, a G pixel region and a B pixel region, the thickness of the hole transport layer corresponding to the R pixel region being an eleventh preset thickness, the thickness of the hole transport layer corresponding to the G pixel region being a twelfth preset thickness, and the thickness of the hole transport layer corresponding to the B pixel region being a thirteenth preset thickness, wherein the eleventh preset thickness is greater than the twelfth preset thickness, and the twelfth preset thickness is greater than the thirteenth preset thickness, and wherein manufacturing an integrated hole transport layer comprises steps as follows:

manufacturing by an entire-surface coating process a hole transport layer having the thirteenth preset thickness between the light emitting layer and the integrated hole injection layer comprising both a hole injection layer having the first preset thickness and a hole injection layer having the second preset thickness;

manufacturing by an inkjet printing process a hole transport layer in both a region corresponding to the G pixel region and a region corresponding to the R pixel region on the hole transport layer having the thirteenth preset thickness such that the thickness of the hole transport layer in both the region corresponding to the G pixel region and the region corresponding to the R pixel region is the twelfth preset thickness; and manufacturing by an inkjet printing process a hole transport layer in a region corresponding to the R pixel region on the hole transport layer having the twelfth preset thickness such that the thickness of the hole transport layer in the region corresponding to the R pixel region is the eleventh preset thickness.

11. The manufacturing method of an organic light emitting diode display panel according to claim 1, wherein the method further comprises manufacturing an electron transport layer between the light emitting layer and the cathode layer.

12. The manufacturing method of an organic light emitting diode display panel according to claim 11, wherein the method further comprises manufacturing an electron injection layer between the cathode layer and the electron transport layer.

13. The manufacturing method of an organic light emitting diode display panel according to claim 1, wherein the entire-surface coating process comprises electrostatic scattering coating or slot die coating.

14. The manufacturing method of an organic light emitting diode display panel according to claim 1, wherein the base substrate is a glass substrate or a flexible substrate.

15. An organic light emitting diode display panel manufactured by using a manufacturing method, comprising manufacturing an anode layer, a light emitting layer and a cathode layer on a base substrate, wherein the manufacturing method further comprises:

manufacturing by an entire-surface coating process a hole injection layer having a first preset thickness between the anode layer and the light emitting layer; and manufacturing by an inkjet printing process a hole injection layer having a second preset thickness in a first preset region of the hole injection layer having the first preset thickness, wherein an area of the first preset region is smaller than that of an upper surface of the hole injection layer having the first preset thickness, such that different pixel regions of the organic light emitting diode display panel have hole injection layers with different thicknesses.

16. A display device, comprising the organic light emitting diode display panel according to claim 15.

17. The organic light emitting diode display panel according to claim 15, wherein the method further comprises:

manufacturing by an entire-surface coating process a hole transport layer having a third preset thickness between the light emitting layer and an integrated hole injection layer comprising both the hole injection layer having the first preset thickness and the hole injection layer having the second thickness; and in a second preset region of the hole transport layer that has been manufactured, manufacturing by an inkjet printing process a hole transport layer having a fourth preset thickness.

18. The organic light emitting diode display panel according to claim 17, wherein the organic light emitting diode display panel comprises an R pixel region, a G pixel region and a B pixel region, the thickness of the hole injection layer corresponding to the R pixel region being a fifth preset thickness, the thickness of the hole injection layer corresponding to the G pixel region being a sixth preset thickness, and the thickness of the hole injection layer corresponding to the B pixel region being a seventh preset thickness, wherein the fifth preset thickness is smaller than the sixth preset thickness, and the sixth preset thickness is smaller than the seventh preset thickness.

19. The organic light emitting diode display panel according to claim 18, wherein manufacturing the integrated hole injection layer comprises steps as follows:

manufacturing by an entire-surface coating process a hole injection layer having the fifth preset thickness between the anode layer and the light emitting layer, the fifth preset thickness being the first preset thickness;

manufacturing by an inkjet printing process a hole injection layer in a region corresponding to the G pixel region on the hole injection layer having the fifth preset thickness such that the thickness of the hole injection layer in the region corresponding to the G pixel region is the sixth preset thickness; and manufacturing by an inkjet printing process a hole injection layer in a region corresponding to the B pixel region on the hole injection layer having the fifth preset thickness such that the thickness of the hole injection layer in the region corresponding to the B pixel region is the seventh preset thickness.

20. The organic light emitting diode display panel according to claim 18, wherein manufacturing the integrated hole injection layer comprises steps as follows:

manufacturing by an entire-surface coating process a hole injection layer having the fifth preset thickness between the anode layer and the light emitting layer, the fifth preset thickness being the first preset thickness;

manufacturing by an inkjet printing process a hole injection layer in both a region corresponding to the G pixel region and a region corresponding to the B pixel region on the hole injection layer having the fifth preset thickness such that the thickness of the hole injection layer in both the region corresponding to the G pixel region and the region corresponding to the B pixel region is the sixth preset thickness; and manufacturing by an inkjet printing process a hole injection layer in a region corresponding to the B pixel region on the hole injection layer having the sixth preset thickness such that the thickness of the hole injection layer in the region corresponding to the B pixel region is the seventh preset thickness.

* * * * *